(12) United States Patent
Tsuzuki et al.

(10) Patent No.: US 9,000,900 B2
(45) Date of Patent: Apr. 7, 2015

(54) VEHICLE PROXIMITY ANNUNCIATOR DEVICE

(71) Applicant: Anden Co., Ltd., Anjo, Aichi-pref. (JP)

(72) Inventors: Haruyuki Tsuzuki, Toyota (JP); Yoshimitsu Ukai, Gifu (JP); Yukiko Matsubara, Chiryu (JP); Chikara Yamamoto, Hekinan (JP)

(73) Assignee: Anden Co., Ltd., Anjo (JP)

( * ) Notice: Subject to any disclaimer, the term of this patent is extended or adjusted under 35 U.S.C. 154(b) by 133 days.

(21) Appl. No.: 13/794,945

(22) Filed: Mar. 12, 2013

(65) Prior Publication Data

US 2013/0257605 A1 Oct. 3, 2013

(30) Foreign Application Priority Data

Mar. 28, 2012 (JP) .................................. 2012-73868

(51) Int. Cl.
| | |
|---|---|
| *B60Q 1/00* | (2006.01) |
| *G08B 3/00* | (2006.01) |
| *G08B 3/10* | (2006.01) |
| *H03F 99/00* | (2009.01) |
| *B60Q 5/00* | (2006.01) |
| *H03F 1/30* | (2006.01) |
| *H03G 3/34* | (2006.01) |
| *H04R 3/02* | (2006.01) |

(52) U.S. Cl.
CPC ................ *B60Q 5/008* (2013.01); *H03F 1/305* (2013.01); *H03G 3/348* (2013.01); *H04R 3/02* (2013.01)

(58) Field of Classification Search
None
See application file for complete search history.

(56) References Cited

U.S. PATENT DOCUMENTS

| | | | |
|---|---|---|---|
| 2005/0084120 A1* | 4/2005 | Hagino ........................ | 381/120 |
| 2012/0105153 A1* | 5/2012 | Doi .............................. | 330/149 |
| 2012/0146780 A1 | 6/2012 | Tsuzuki et al. | |

FOREIGN PATENT DOCUMENTS

| | | |
|---|---|---|
| JP | 2012-017071 A | 1/2012 |
| WO | 2013/014865 A1 | 1/2013 |

* cited by examiner

*Primary Examiner* — Julie Lieu
(74) *Attorney, Agent, or Firm* — Posz Law Group, PLC

(57) ABSTRACT

A vehicle proximity annunciator device reduces an occurrence of a pop noise without an additional circuit changing an output of a power amplifier. A capacitor is located between a connection point connecting multiple resistances generating a reference voltage and a ground terminal. The capacitor causes a rise-up time of the reference voltage to delay at a start of power supply to a power source terminal. A sound emission signal is increased at substantially a same level of the reference voltage so that a variation of a differential voltage between the reference voltage and the sound emission signal falls in a pre-determined range.

6 Claims, 6 Drawing Sheets

VEHICLE PROXIMITY ANNUNCIATOR DEVICE

CROSS REFERENCE TO RELATED APPLICATION

This application is based on Japanese Patent Application No. 2012-73868 filed on Mar. 28, 2012, the disclosure of which is incorporated herein by reference.

TECHNICAL FIELD

The present disclosure relates to a vehicle proximity annunciator device to notify proximity of a vehicle by outputting an annunciation sound from a speaker equipped in a vehicle.

BACKGROUND

An electric vehicle, which is equipped with only an electric motor as driving source, emits a significantly low traveling sound when traveling at a low speed. Similarly a hybrid vehicle, which is equipped with an electric motor and an internal combustion engine as driving sources, also emits a significantly low traveling sound when traveling at a low speed only with driving power of the electric motor. Accordingly, a pedestrian or other person may not notice proximity of such a vehicle.

In consideration of this, a vehicle proximity annunciator device equipped in such a low noise vehicle is used practically, for example, as described in JP-A-2012-17071. The vehicle proximity annunciator device generates an annunciation sound signal of which a frequency changes according to a vehicle speed and emits an annunciation sound based on the annunciation sound signal to the outside of the vehicle to notify a pedestrian and the like around the vehicle of existence of the vehicle.

The vehicle proximity annunciator device as described above begins to operate when the vehicle proximity annunciator device is supplied with electric power via an ignition (IG) power supply of a vehicle battery according to an operation of a starter switch and the like. When the vehicle proximity annunciator device begins to operate, a pop noise such as a pop and the like is generated in a speaker causes a reduction of commercial value.

SUMMARY

It is an object of the present disclosure to provide a vehicle proximity annunciator device, reducing an occurrence of a pop noise.

According to one aspect of the present disclosure, a vehicle proximity annunciator device for notifying vehicle proximity by emitting an annunciation sound from a speaker equipped in a vehicle includes (i) a reference voltage generation circuit, (ii) a sound emission signal generation portion, (iii) a power amplifier, (iv) a coupling capacitor, and (v) a rise-up delay capacitor. The reference voltage generation circuit generates a reference voltage. The reference voltage is obtained by dividing a power supply voltage, which is applied to a power source terminal, by multiple resistances. The sound emission signal generation portion generates a sound emission signal. The power amplifier outputs an amplified signal from an output terminal of the power amplifier. The amplified signal is generated by amplifying a differential voltage between the reference voltage and voltage of the sound emission signal. The coupling capacitor is located between the output terminal of the power amplifier and the speaker. The rise-up delay capacitor is located between a connection point connecting the multiple resistances, which generate the reference voltage, and a ground terminal. The rise-up delay capacitor causes a rise-up time of the reference voltage to delay at a start of power supply to the power source terminal. The sound emission signal generation portion increases the sound emission signal with substantially a same voltage level as the reference voltage so that a variation of the differential voltage between the reference voltage and the voltage of the sound emission signal falls in a pre-determined range.

According to the above vehicle proximity annunciator device, it is possible to reduce an occurrence of a pop noise.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 5:
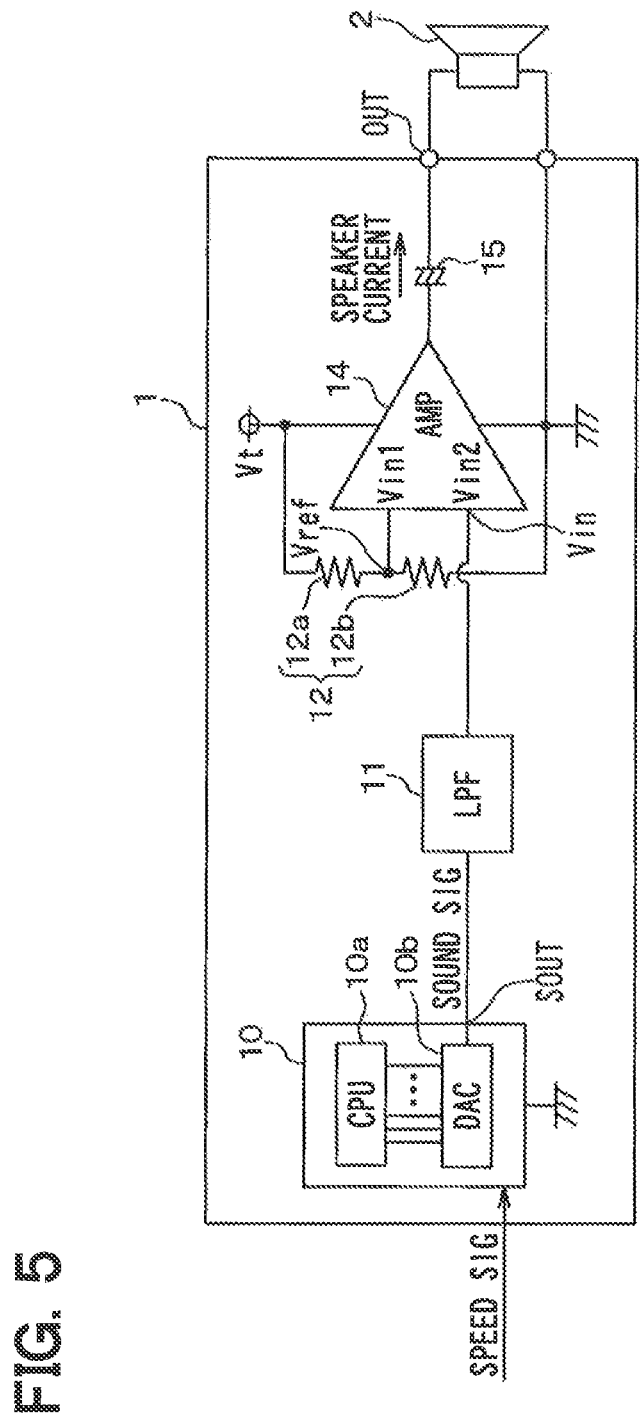
FIG. 5 is a circuit diagram illustrating a vehicle proximity annunciator device of a comparison embodiment.

For example, a configuration of a vehicle proximity annunciator device is shown in FIG. 5. We will describe a generating mechanism of a pop noise with reference to FIG. 5. The vehicle proximity annunciator device includes a control unit 10 which outputs a sound emission signal, a low-pass filter (LPF) 11 which extracts a low-frequency component of the sound emission signal to remove a high-frequency component from the sound emission signal, a power amplifier (AMP) 14, and a coupling capacitor 15. The AMP 14 outputs an amplified signal which is a differential voltage between a reference voltage Vref and a sound emission signal voltage Vin. The reference voltage Vref is obtained by dividing a power supply voltage, which is applied to a power source terminal Vt, by resistances 12a, 12b. The sound emission signal voltage Vin is inputted from the control unit 10 through the LPF 11. The coupling capacitor 15 connects the AMP 14 with a speaker 2 by AC coupling.

Figure 6:
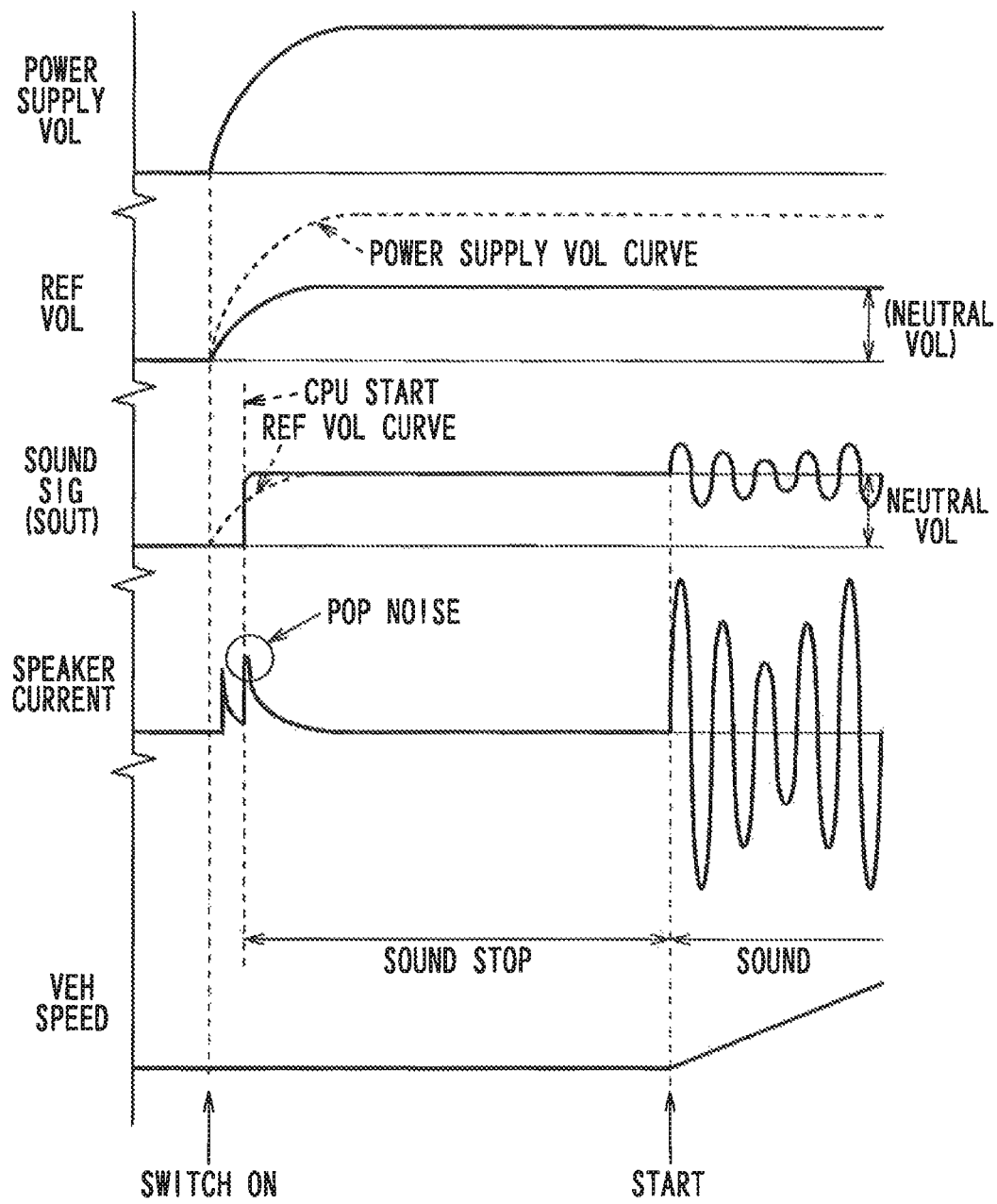
FIG. 6 is a graph illustrating each waveform of a power supply voltage, a reference voltage, a sound emission signal and a speaker current in FIG. 5.

In FIG. 6, each waveform of the power supply voltage, the reference voltage, the sound emission signal, and a speaker current of the vehicle proximity annunciator device described in FIG. 5 is illustrated. A characteristic of a vehicle speed is also illustrated in FIG. 6. In cases where the vehicle proximity annunciation device is supplied with electric power of the IG power supply according to operation of a starter switch and the like of the vehicle, the power supply voltage and the reference voltage increase with the waveforms in FIG. 6.

The control unit 10 is set to start after a pre-determined interval from starting an electric power supply. The sound emission signal is outputted from the control unit 10 a little later from increase of a power source voltage until the value of the sound emission signal reaches the value of the neutral voltage, which is equal to the reference voltage, from 0 V. When the control unit 10 judges that the vehicle begins to travel based on a vehicle speed signal, the control unit 10 outputs an alternating current sound emission signal which has the neutral voltage as a central value. The AMP 14 outputs the amplified signal which is the differential voltage between the sound emission signal and the reference voltage.

In a transition period immediately after the start of the power supply to the power source terminal Vt, a relatively high speaker current (charging current) flows into the coupling capacitor 15 from the AMP 14. The charging current causes a pop noise.

It is effective that a switching circuit is arranged in an output terminal side of the AMP 14 and connects the output of the AMP 14 with the speaker after a pre-determined interval from starting the electric power supply so as to reduce the pop noise. However, it is not desirable because the number of parts count can be increased.

(Embodiment)

Figure 1:
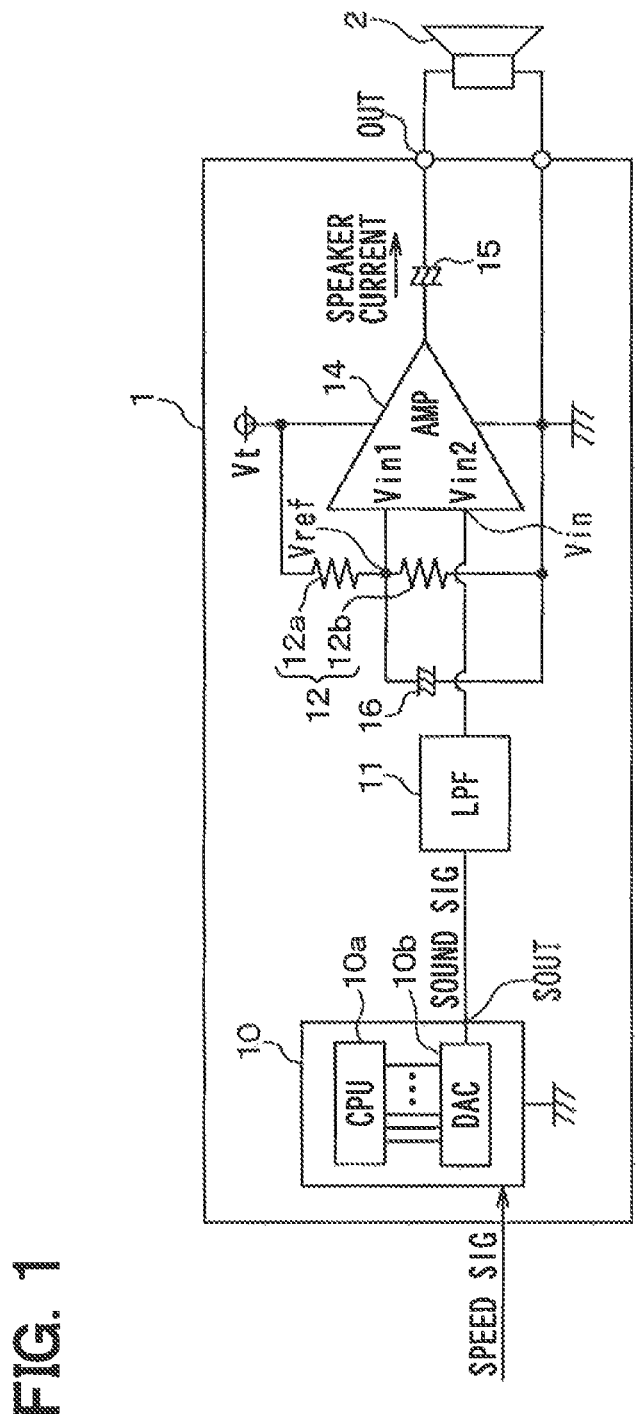
FIG. 1 is a circuit diagram illustrating a vehicle proximity annunciator device in one embodiment.

A circuit diagram of a vehicle proximity annunciator device 1 in the present embodiment is illustrated in FIG. 1. The vehicle proximity annunciator device 1 notifies a pedestrian and the like around a vehicle of proximity of the vehicle by emitting an annunciation sound from the speaker 2 equipped in the vehicle.

The vehicle proximity annunciator device 1 includes the control unit 10, the LPF 11, resistances 12a, 12b, the AMP 14, the coupling capacitor 15, and a capacitor 16. Each the coupling capacitor 15 and the capacitor 16 connects the power amplifier 14 and the speaker 2 by AC coupling.

The control unit 10 includes a microcomputer including a CPU 10a and a digital/analog converter (DAC) 10b. The control unit 10 includes a sound emission signal generation portion which generates the sound emission signal and outputs to the LPF 11 so that the speaker 2 outputs the annunciation sound. The LPF 11 receives a vehicle speed signal from a vehicle speed sensor (not shown).

In the present embodiment, the control unit 10 can correspond to an example of the sound emission signal generation portion. Additionally, the capacitor 16 can correspond to an example of a rise-up capacitor.

Figure 2:
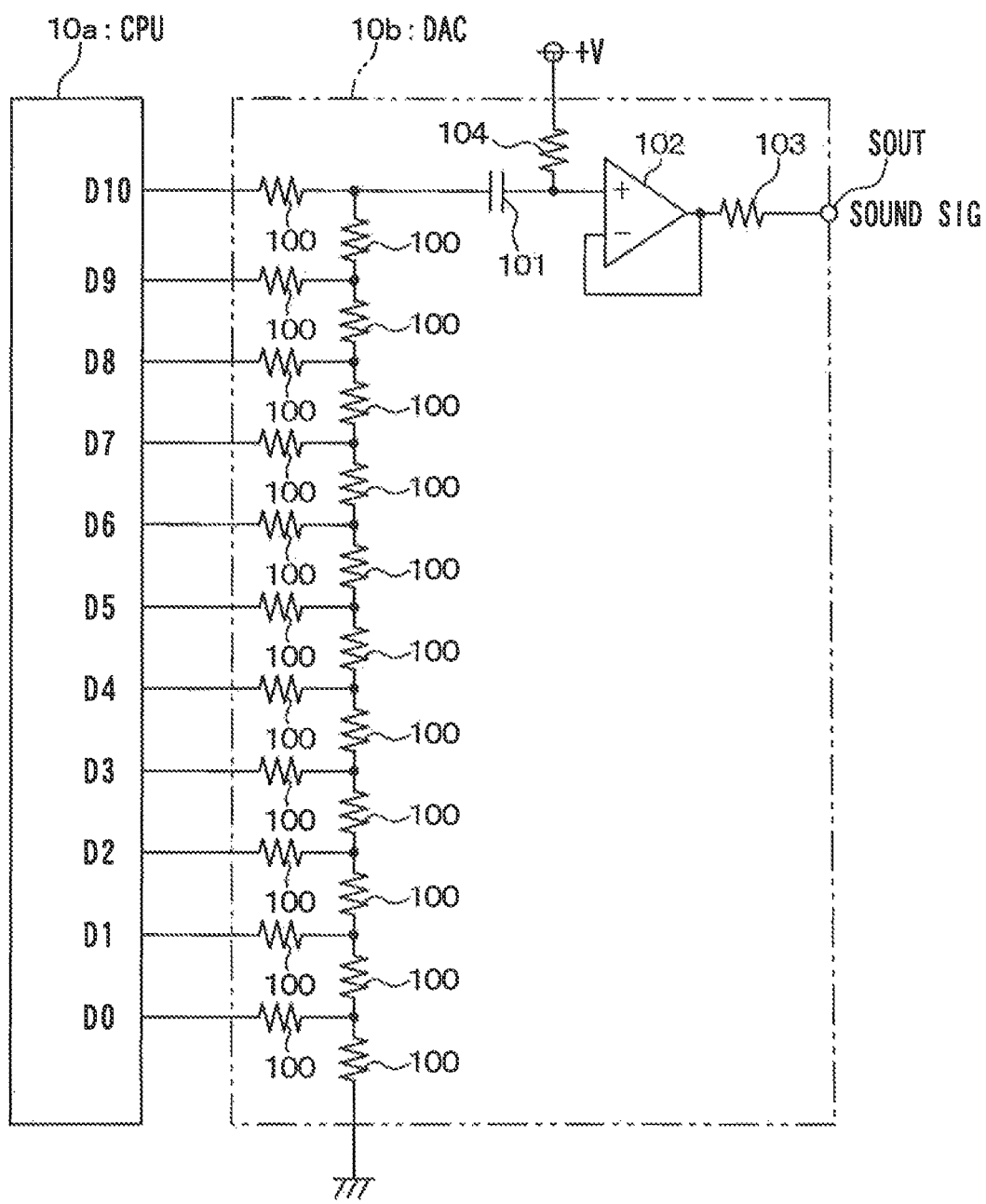
FIG. 2 is a circuit diagram illustrating a digital/analog converter (DAC)

The control unit 10 includes a RAM, a ROM, an I/O device and the like (not shown). The CPU 10a executes a program stored in the ROM As shown in FIG. 2, data output terminals D0 to D10 of the CPU10a are connected with the DAC 10b. The CPU 10a outputs a digital signal from 000f to 3FFh in a hexadecimal notation via the data output terminals D0 to D10. The data output terminal D0 is for a least significant bit (LSB). The data output terminal D10 is for a most significant bit (MSB).

The DAC 10b includes R-2R ladder resistance network having multiple ladder resistances 100, a capacitor 101, an operational amplifier 102, and resistances 103, 104. A combined resistance value of the R-2R ladder resistance network changes gradually according to voltage levels of the data output terminals D0 to D10 of the CPU 10a.

A level shift circuit includes the capacitor 101, the operational amplifier 102 and resistances 103, 104. The level shift circuit enables to change the voltage level according to the combined resistance of the R-2R ladder resistance network.

An output terminal SOUT outputs a voltage according to the voltage level of the data output terminals D0 to D10 of the CPU 10a, that is, according to the combined resistance value of the R-2R ladder resistance network.

The LPF 11 extracts a low-frequency component from a sound emission signal to remove a high-frequency component such as higher harmonics. The LPF 11 in the present embodiment includes a resistance R and a capacitor C to be combined with the AMP 14.

A reference voltage generation circuit 12 generates a reference voltage Vref which is obtained by dividing a power supply voltage, which is applied to a power source terminal Vt, by the resistances 12a, 12b.

The AMP 14 is a differential amplifier which amplifies a differential voltage between the reference voltage Vref and a voltage Vin. The reference voltage Vref is applied to an input terminal Vin1. The voltage Vin is applied to an input terminal Vin2.

The coupling capacitor 15 removes a DC component included in the output signal of the AMP 14 to extract an AC component from the output signal. The coupling capacitor 15 connects the AMP 14 with the speaker 2 by AC coupling.

The speaker 2 outputs the annunciation sound according to an input signal from the AMP 14 via the coupling capacitor 15.

In the embodiment described above, when the power source terminal Vt is supplied with electric power from a vehicle battery according to an operation of a starter switch and the like, the reference voltage Vref is inputted to the input terminal Vin1 of the AMP 14. The reference voltage Vref is obtained by dividing the power supply voltage, which is applied to the power source terminal Vt, by the resistances 12a, 12b. The sound emission signal generated in the control unit 10 is inputted to the input terminal Vin2 of the AMP 14 via the LPF 11. The AMP 14 outputs a signal obtained by amplifying the differential voltage between the reference voltage Vref and the sound emission signal. The output signal from the AMP 14 is inputted to the speaker 2 equipped in the vehicle via the coupling capacitor 15. Then, the speaker 2 outputs the annunciation sound according to the output signal from the AMP 14.

A charging current flowed from the AMP 14 to the coupling capacitor 15 causes a pop noise when starting power supply. In the present embodiment, in order to prevent this charging current, the control unit 10 includes the capacitor 16 arranged between a connection point where the resistances 12a, 12b are connected and a grounding terminal, and additionally, the control unit 10 increases the sound emission signal in such a manner that at the start of power supply to the power source terminal, the voltage of the sound emission signal increases in phase with the reference voltage so that the variation of the differential voltage between the reference voltage and the voltage of the sound emission signal is less than a pre-determined value.

The capacitor 16 is arranged so that a rise-up time of the reference voltage at the start of power supply is longer than a period of, for example 25 ms, corresponding to a frequency which is much lower than a speaker resonance frequency.

The rise-up time of the reference voltage Vref is changed with a time constant that is based on the resistance values of the resistances 12a, 12b and the capacitance value of the capacitor 16. In general, a minimum audible frequency is about 20 Hz. A rise-up time of a waveform of 20 Hz corresponds to 25 ms in a case where the minimum audible frequency is 20 Hz.

In the present embodiment, the capacitance value of the capacitor 16 is determined so that the rise-up time of the reference voltage is much longer than the period of 25 ms corresponding to the minimum audible frequency.

In the present embodiment, at the start of power supply, a rise-up characteristic (e.g., time) of the reference voltage becomes moderate, and additionally, the sound emission signal is gradually increased to a neutral voltage along an ascending curve of the reference voltage at the start of the power supply.

Figure 3:
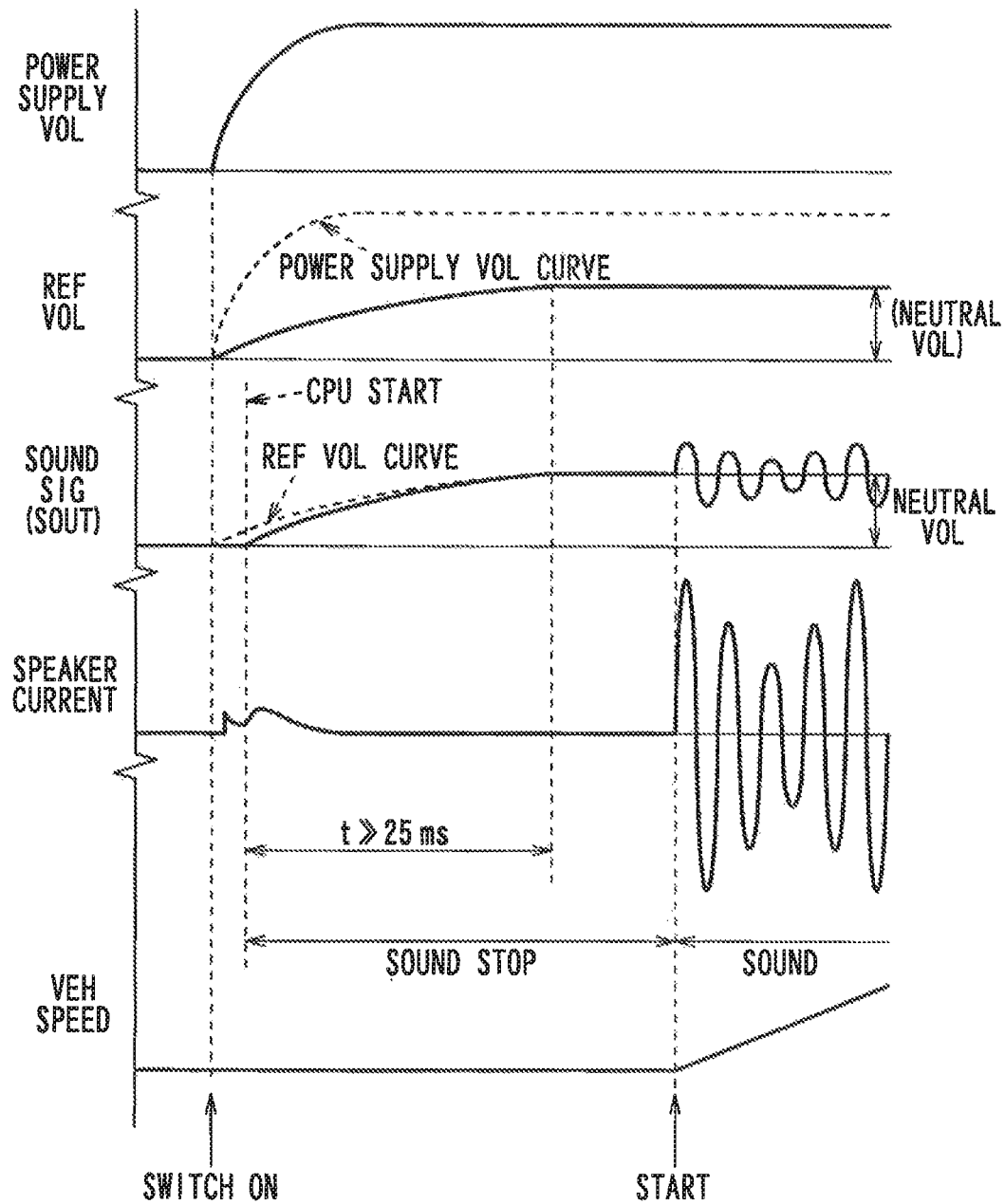
FIG. 3 is a graph illustrating each waveform of a power supply voltage, a reference voltage, a sound emission signal and a speaker current of the vehicle proximity annunciator device in the present embodiment.

FIG. 3 Illustrates each waveform of a power supply voltage, a power amplifier input reference voltage, a sound emission signal outputted from the control unit, and a speaker current (a charging current) passing through the speaker 2 of the vehicle proximity annunciator device. In cases where the vehicle proximity annunciator device is supplied with electric power via an IG power supply from a vehicle battery, the power source voltage increases having the waveform in FIG. 3.

In the present embodiment, because the capacitor 16 is arranged between the connection point where the resistances 12a, 12b are connected and the grounding terminal, the reference voltage Vref has a gradually rising waveform as shown in FIG. 3.

The control unit 10 in the present embodiment outputs the sound emission signal according to a program prestored in a memory. Specifically, at the start of the power supply to the power source terminal Vt, the control unit 10 gradually increases the sound emission signal along the ascending curve of the reference voltage until the sound emission signal reaches a neutral voltage. When the control unit 10 judges that the vehicle begins to travel based on the vehicle speed signal, the control unit 10 outputs the AC sound emission signal whose center value is the neutral voltage.

As described above, the rise-up characteristic (time) of the reference voltage at the start of the power supply is gradually increased by locating the capacitor 16 between the connection point where the resistances 12a, 12b are connected and the grounding terminal. The control unit 10 gradually increases the sound emission signal along the ascending curve of the reference voltage until the sound emission signal reaches a neutral voltage at the start of the power supply to the power source terminal Vt. Thus, the charging current which causes a pop noise in the speaker 2 when passing through the coupling capacitor 15 can be decreased.

Figure 4:
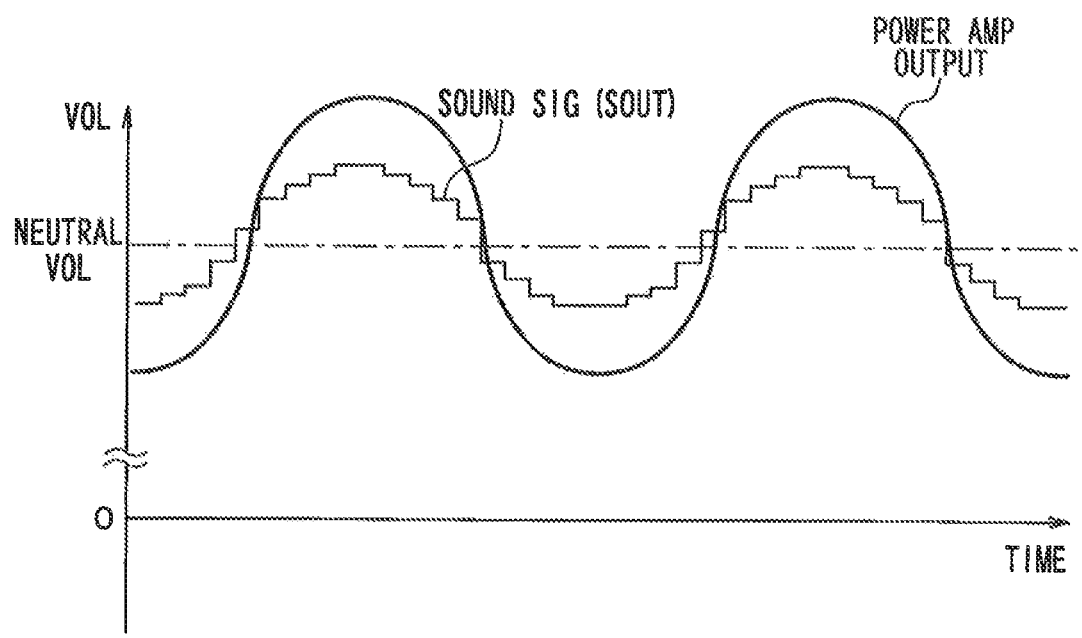
FIG. 4 is a graph illustrating each waveform of a sound emission signal from a control unit and an output signal from a power amplifier (AMP)

FIG. 4 illustrates each waveform of the AC sound emission signal outputted from the control unit 10 and the output signal of the AMP 14 after the vehicle begins to travel. As shown in FIG. 4, the AMP 14 outputs an amplified signal which corresponds to the differential voltage between the reference voltage and the sound emission signal. The amplified signal has the neutral voltage as its center value. The speaker 2 connected with the output terminal OUT receives the output signal from the AMP 14 through the coupling capacitor 15. The speaker 2 emits the annunciation sound according to the sound emission signal.

In the manner described above, the capacitor 16 is arranged between the connection point where the resistances 12a, 12b are connected and the grounding terminal. The capacitor 16 delays the increase of the reference voltage at the start of the power supply to the power source terminal. At the start of the power supply to the power source terminal, the control unit 10 increases the sound emission signal at substantially the same level as the reference voltage so that the variation of the differential voltage between the reference voltage and the voltage of the sound emission signal falls in a range of a pre-determined value. The charging current flowing into the coupling capacitor is decreased at the start of the power supply to the power source terminal. An occurrence of the pop noise can be prevented without adding a switching circuit which changes a power amplifier output level.

It is noted that the present disclosure is not limited to the present embodiment. It should be understood that various modifications can be made.

For example, in the above-illustrated configuration of the embodiment, the sound emission signal is generated by changing the combined resistance of the R-2R ladder resistance network having the multiple ladder resistances 100, and the sound emission signal is increased according to the rise-up characteristic of the reference voltage at the start of the power supply. However, this configuration does not limit the embodiment. For example, in another configuration, the vehicle proximity annunciator device 1 may include a RC circuit for providing such a rise-up characteristic to the sound emission signal as gradually rising up the sound emission signal, and additionally, the sound emission signal may be increased according to the rise-up characteristic of the reference voltage at the start of the power supply.

Moreover, in the present embodiment, the control unit 10 gradually increases the sound emission signal along the ascending curve of the reference voltage at the start of the power supply to the power source terminal Vt until the sound emission signal reaches a neutral voltage. However, it may be not necessary that the sound emission signal is increased to the neutral voltage along the ascending curve of the reference voltage. Thus, it may suffice that the sound emission signal and the reference voltage may increase at the same level to such an extent that the variation of the differential voltage between the reference voltage and the voltage of the sound emission signal falls in a range that prevent an occurrence of the pop noise at the start of the power supply.

Summarizing the above embodiment, a vehicle proximity annunciation device for notifying proximity of a vehicle outputs an annunciation sound from a speaker equipped in the vehicle. The vehicle proximity annunciation device includes a reference voltage generation circuit, a sound emission signal generation portion, a power amplifier, a coupling capacitor, and a rise-up delay capacitor. The reference voltage generation circuit generates a reference voltage which is obtained by dividing a power source voltage, which is applied to a power source terminal, by multiple resistances. The sound emission signal generation portion generates a sound emission signal. The power amplifier outputs an amplified signal from an output terminal of the power amplifier. The amplified signal is generated by amplifying a differential voltage between the reference voltage and voltage of the sound emission signal. The coupling capacitor is arranged between the output terminal of the power amplifier and the speaker. The coupling capacitor is arranged between a connection point, at which the multiple resistances for generating the reference voltage are connected, and a grounding terminal. The coupling capacitor delays a rise-up of the reference voltage at the start of power supply to the power source terminal. The sound emission signal generation portion increases the sound emission signal with substantially a same voltage level as the reference voltage so that a variation of the differential voltage between the reference voltage and the voltage of the sound emission signal falls in a pre-determined range.

In the present structure, the coupling capacitor is arranged between the connection point of the resistances and the grounding terminal to delay the increase of the reference voltage at the start of the power supply to the power source terminal. The sound emission signal generation portion increases the sound emission signal with substantially the same voltage level as the reference voltage so that the variation of the differential voltage between the reference voltage and the voltage of the sound emission signal falls in the pre-determined range. Therefore, a charging current flowing into the coupling capacitor is decreased at the start of the power supply to the power source terminal, so that an occurrence of the pop noise can be reduced without adding a switching circuit which changes a power amplifier output.

The occurrence of the pop noise at the start of the power supply to the power source terminal can reduced more definitely by setting a rise-up time of the reference voltage to a period longer than a period corresponding to a minimum audible frequency.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A vehicle proximity annunciator device for notifying vehicle proximity by emitting an annunciation sound from a speaker equipped in a vehicle, the vehicle proximity annunciator device comprising:
    a reference voltage generation circuit generating a reference voltage obtained by dividing a power supply voltage, which is applied to a power source terminal, by a plurality of resistances;
    a sound emission signal generation portion generating a sound emission signal;
    a power amplifier outputting an amplified signal from an output terminal of the power amplifier, the amplified signal being generated by amplifying a differential voltage between the reference voltage and voltage of the sound emission signal;
    a coupling capacitor located between the output terminal of the power amplifier and the speaker; and
    a rise-up delay capacitor located between a connection point connecting the plurality of resistances generating the reference voltage and a ground terminal, wherein the rise-up delay capacitor causes a rise-up time of the reference voltage to delay at a start of power supply to the power source terminal,
    wherein
    the sound emission signal generation portion increases the sound emission signal with substantially a same voltage level as the reference voltage so that a variation of the differential voltage between the reference voltage and the voltage of the sound emission signal falls in a threshold range.

2. The vehicle proximity annunciator device according to claim 1, wherein
    a rise-up time of the reference voltage at the start of power supply to the power source terminal is longer than a period corresponding to a minimum audible frequency.

3. The vehicle proximity annunciator device according to claim 1, wherein:
    in response to supply of electric power from a vehicle battery to the vehicle proximity annunciator device, the reference voltage and the sound emission signal rise up while having substantially the same voltage level.

4. The vehicle proximity annunciator device according to claim 1, wherein:
    in response to supply of electric power from a vehicle battery to the vehicle proximity annunciator device, the power supply to the power source terminal starts; and
    a capacitance of the rise-up delay capacitor is determined so that the rise-up time of the reference voltage at the start of power supply to the power source terminal is longer than 25milliseconds, which corresponds to the minimum audible frequency.

5. The vehicle proximity annunciator device according to claim 1, wherein:
    the vehicle proximity annunciator device is mounted to an electric vehicle or a hybrid vehicle.

6. A vehicle proximity annunciator device for notifying vehicle proximity, comprising:
    a power source including a power source terminal;
    a reference voltage generation circuit including a plurality of resistors that divide a power supply voltage to generate a reference voltage to be applied to the power source terminal;
    a sound emission signal generation portion generating a sound emission signal;
    a power amplifier including an output terminal, which outputs an amplified signal;
    a speaker electrically coupled to the power amplifier;
    a coupling capacitor located between the output terminal of the power amplifier and the speaker; and
    a rise-up delay capacitor located between a connection point connecting the plurality of resistors in the reference voltage generation circuit and ground, wherein
    the amplified signal is generated by amplifying a differential voltage between the reference voltage and voltage of the sound emission signal,
    the rise-up delay capacitor causes a rise-up time of the reference voltage to delay at a start of power supply to the power source terminal, and
    the sound emission signal generation portion increases the sound emission signal with the voltage level that is substantially the same as the reference voltage.

* * * * *